(12) United States Patent
Kawahara

(10) Patent No.: US 7,627,011 B2
(45) Date of Patent: Dec. 1, 2009

(54) DISTRIBUTED FEEDBACK LASER DIODE AND A METHOD FOR MANUFACTURING THE SAME

(75) Inventor: Takahiko Kawahara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/649,784

(22) Filed: Jan. 5, 2007

(65) Prior Publication Data

US 2007/0160105 A1 Jul. 12, 2007

(30) Foreign Application Priority Data

Jan. 10, 2006 (JP) ............... 2006-002796

(51) Int. Cl.
*H01S 5/00* (2006.01)
*H01S 3/08* (2006.01)
(52) U.S. Cl. ..................... 372/50.11; 372/96
(58) Field of Classification Search ............. 372/96, 372/50.11
See application file for complete search history.

(56) References Cited

U.S. PATENT DOCUMENTS 5,771,256 A * 6/1998 Bhat ................ 372/45.01

2004/0057483 A1 * 3/2004 Takemi et al. ............ 372/45
2005/0123018 A1 * 6/2005 Takagi et al. ............. 372/96
2005/0286582 A1 * 12/2005 Hayakawa et al. ...... 372/44.01

FOREIGN PATENT DOCUMENTS

JP 11-195836 7/1999

* cited by examiner

*Primary Examiner*—Minsun Harvey
*Assistant Examiner*—Patrick Stafford
(74) *Attorney, Agent, or Firm*—Smith, Gambrell & Russell, LLP

(57) ABSTRACT

The present invention is to provide a DFB-LD with a larger coupling efficiency between the grating and the active layer. The DFB-LD of the invention provides an n-type InP substrate, an n-type InP buffer layer, an AlGaInAs layer, a intermediate layer made of a material belonging to a group III-V compound semiconductor and containing phosphorous, and an active layer. The InP substrate and the InP buffer layer form a periodic undulation of the grating. Because of the AlGaInAs layer just provided on the InP buffer layer, the AlGaInAs layer and the intermediate layer can be thinned to get a flat top surface, which enhances the coupling efficiency between the grating and the active layer.

15 Claims, 6 Drawing Sheets

DISTRIBUTED FEEDBACK LASER DIODE AND A METHOD FOR MANUFACTURING THE SAME

BACKGROUND OF THE INVENTION

1. Field of the Invention

The present invention relates to a semiconductor laser diode with a distributed feedback function.

2. Related Prior Art

A Japanese Patent application published as JP-H11-195836A has disclosed a semiconductor laser diode with the distributed feedback type (hereinafter denoted as DFB-LD) and a method for producing the laser diode. This process forms, at a first temperature, an optical guiding layer on a semiconductor substrate with a periodic undulation for the grating until the surface of the guiding layer becomes plane. Subsequently, as raising the temperature up to a second value, first and second spacer layers, both made of same material with the substrate, are formed thereon, and an active layer is finally grown at the second temperature. This method for the laser diode realizes reproducibility of the dimensions of the grating and good crystal quality of the active layer, which enables to produce the laser diode with superior performance and reliability by an enough yield.

In the DFB-LD with a type where the grating formed on the InP substrate is buried with AlGaInAs layer, a difference in the diffractive index between two layers both forming the grading may be expanded compared to a DFB-LD where the grating is buried by a GaInAsP layer. For example, when the band gap wavelength of the n-type AlGaInAs is 1.1 µm, the difference in the refractive index between the n-type InP and the n-type AlGaInAs may be 0.19, which is greater than the difference in the refractive index between the n-type GaInAsP and the n-type InP. That is, assuming the depth or the height of the periodic undulation for the grating is equivalent, the combination of semiconductor materials showing larger difference in the refractive index can give a larger coupling efficiency κL.

The coupling efficiency κL is preferably between 1.0 to 1.4 for the DFB-LD with the emission wavelength in the 1.3 µm bands and with the AlGaInAs layer for the grating. Forming the periodic undulation with a larger depth about 40 nm to get a large coupling efficiency κL, a thicker AlGaInAs layer becomes necessary to compensate the undulation to make the surface thereof flat. For instance, the thickness of the AlGaInAs layer becomes about 90 nm, which is a length from the bottom to the top of the undulation, to get a flat surface. Burying the grating with the undulation thereof about 40 nm by the AlGaInAs layer, a distance between the grating and the active layer becomes long because the AlGaInAs layer is necessary to be enough thick to get a flat surface, which prevents to increase the coupling efficiency κL and sometimes causes a failure in the side mode suppression ratio (SMSR).

The present invention is to provide a solution for the DFB-LD where the coupling efficiency becomes relatively large.

SUMMARY OF THE INVENTION

One aspect of the present invention relates to a semiconductor laser diode with a distributed feedback function by an optical grating. The laser diode comprises an InP semiconductor region, an AlGaInAs layer provided on the InP region, an intermediate layer provided on the AlGaInAs layer, and the active layer provided on the intermediate layer. The InP region provides a periodic undulation on a primary surface thereof to show the distributed feedback function. The intermediate layer is made of a material of a group III-V compound semiconductor and contains phosphorous (P) as a group III-V element. The active layer has a quantum well structure. In the present invention, the optical grating is constituted by at least the InP region and the AlGaInAs layer.

The present DFB-LD provides the intermediate layer between the AlGaInAs layer and the active layer, and this intermediate layer contains the phosphorous as the group V element, accordingly, a mass transportation may be accelerated during the growth of the intermediate layer, which facilitates the burying of the periodic undulation without making the total thickness of the AlGaInAs layer and the intermediate layer thick.

Another aspect of the present invention relates to a method for manufacturing a semiconductor laser diode with a distributed feedback type. The method includes steps of: (a) preparing an InP substrate, (b) growing a series of semiconductor layers on the InP substrate, (c) forming a mesa stripe by a dry etching technique, and burying the mesa stripe with an InP layer doped with iron. The InP substrate provides a periodic undulation on a primary surface thereof. The step of growing the semiconductor layers includes, (b-1) growing an AlGaInAs layer on the InP substrate at a first temperature, (b-2) growing, at a second temperature higher than the first temperature, an intermediate layer that is made of a III-V compound semiconductor and contains phosphorous as a group V element, (b-3) growing an active layer at a third temperature, (b-4) growing, at the second temperature, an AlGaInAs optical guiding layer, an InP cladding layer, an upper intermediate layer made of III-V compound semiconductor containing phosphorous as the group V element, and an GaInAs contact layer.

Since the intermediate layer contains phosphorous as the group V element and is grown at the second temperature higher than the first temperature, the mass transportation may be accelerated during the growth of this layer. Accordingly, a flat surface of the intermediate layer may be obtained without making the total thickness of the AlGaInAs layer and the intermediate layer thick, which enhances the coupling efficiency κL between the optical grating and the active layer.

DESCRIPTION OF PREFERRED EMBODIMENTS

Subjects of the present invention will be easily understood by considering a specification presented below as referring to accompanying drawing. Next, embodiments of the present invention relating to a DFB-LD will be described as referring to drawings. In the description of the drawings, the same numerals or the same symbols will refer to the same elements without overlapping explanations.

Figure 1:
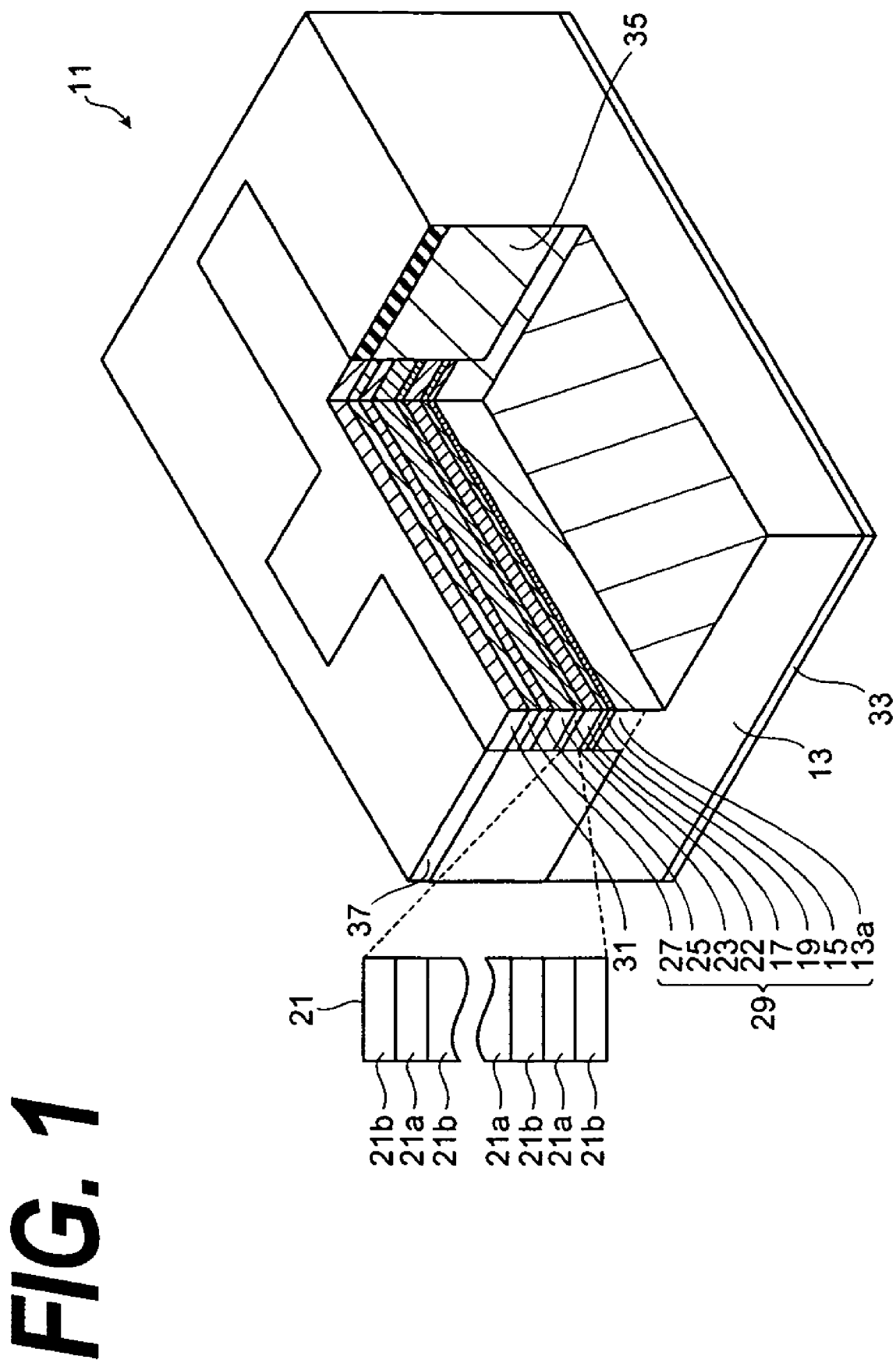
FIG. 1 is a perspective view showing a distributed feedback laser diode (DFB-LD) according to an embodiment of the present invention.
Figure 2:
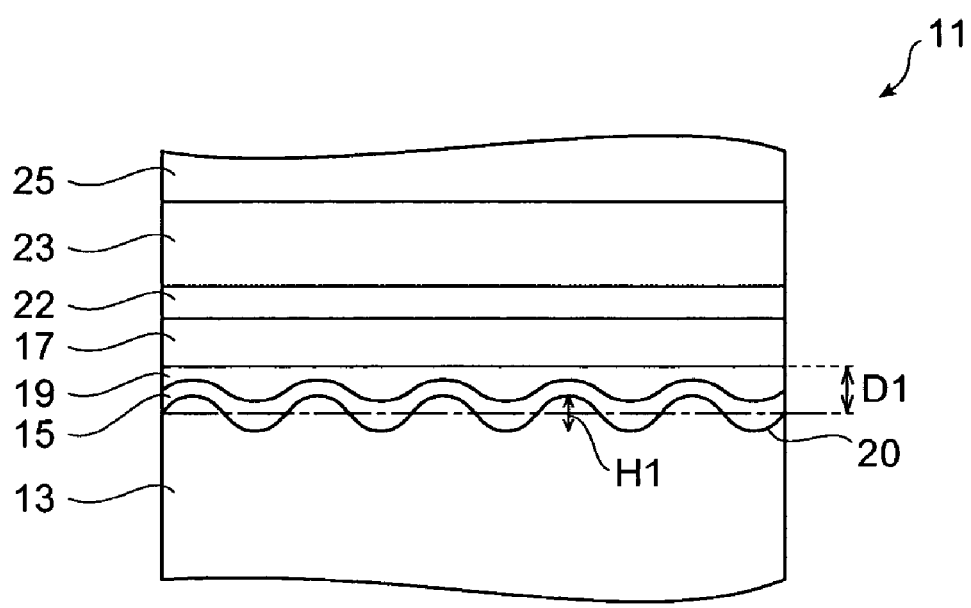
FIG. 2 magnifies a grating of the DFB-LF shown in FIG. 1.

FIG. 1 shows a distributed feedback laser diode (hereinafter denoted as DFB-LD), while FIG. 2 magnifies the grating of the DFB-LD shown in FIG. 1. The DFB-LD 11 includes an InP semiconductor region 13, an AlGaInAs semiconductor layer 15, an active layer 17, and a group III-V compound intermediate layer 19. The InP region 13 with a first conduction type, for example, an n-type conduction type may include an InP substrate with the first conduction type and an InP buffer layer provided on the InP substrate. The active region 17 has a quantum well structure 21 provided on the AlGaInAs layer 15. The quantum well structure 21 includes a plurality of well layers 21a and a plurality of barrier layer 21b. These well and barrier layers are stacked alternately to each other. The intermediate layer 19 involves a layer containing phosphorous atoms as a group V element and is put between the AlGaInAs layer 15 and the active layer 17. Referring to FIG. 2, the InP region 13 provides a periodic undulation 20 for the distributed feedback. The AlGaInAs layer 15 is arranged on the periodic undulation 20 in the InP layer 13. Thus, the periodic undulation 20 includes at least a portion of the InP region 13 and a portion of AlGaInAs layer 15.

As shown in FIG. 2, the DFB-LD 11 according to the present invention provides the semiconductor layer 19 between the AlGaInAs layer 15 and the active layer 17 and this layer 19 is made of material containing phosphorous atoms, accordingly, the periodic undulation 20 may be buried without setting a total thickness D1 of the intermediate layer 19 and the AlGaInAs layer 15, in another words, without making the active layer 17 apart from the grating.

Figure 3:
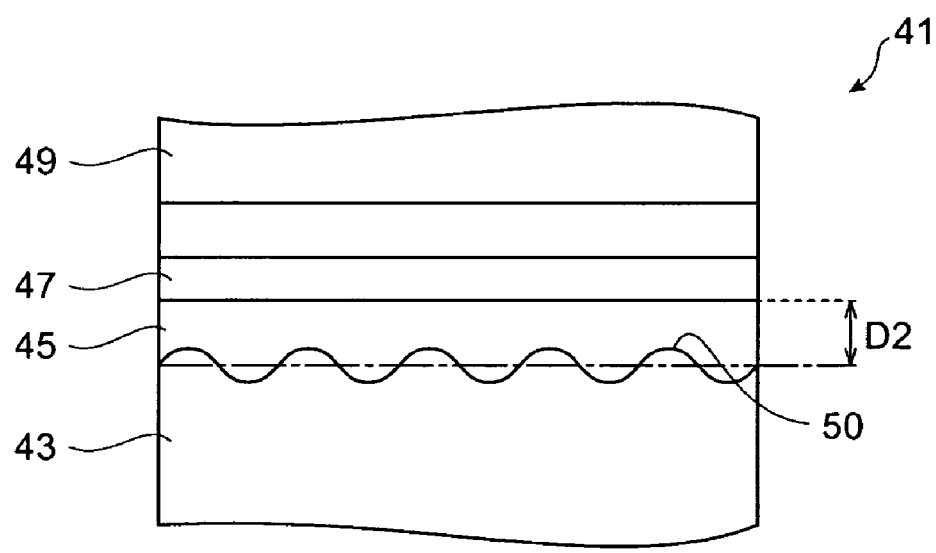
FIG. 3 magnifies a grating of a conventional DFB-LD.

On the other hand, a conventional DFB-LD forms the active layer 47 on the n-type InP region 43 as shown in FIG. 3. Between the active layer 47 and the InP region 43 is provided with a guiding layer 45. Moreover, the active layer 47 is put between the n-type InP region 43 and the p-type semiconductor region made of group III-V compound semiconductor material. The InP region 43 provides the periodic undulation 50 for the distributed feedback and this periodic undulation is buried by the optical guiding layer 45. Because the optical guiding layer 45 is made of AlGaInAs, it is inevitable for the thickness D2 of the optical guiding layer 45 to be thick enough to bury the grating and to form the active layer 47 on the surface of the guiding layer 45 with enough quality. That is, the thickness D2 of the guiding layer in the conventional DFB-LD is greater than the thickness D1 of the AlGaInAs layer of the present invention.

Referring to FIGS. 1 and 2 again, the DFB-LD 11 of the present invention further includes an optical guiding layer 22 and a cladding layer 23 with a second conduction type, which may function as a p-type cladding layer, while, a portion of the InP region 13 may function as an n-type cladding layer. The DFB-LD 11 may further include an intermediate layer 25 with the second conduction type on the upper cladding layer 23 and a contact layer 27.

The DFB-LD 11 provides a mesa 29 extending along a preset orientation. The mesa 29 includes, from the lower side thereof, a portion 13a of the InP region 13, the AlGaInAs layer 15, the active layer 17, the intermediate layer 19, the optical guiding layer 22, the upper cladding layer 23, the intermediate layer 25, and the contact layer 27. On the mesa 29 is formed with an electrode 33, while, another electrode 33 is formed in the back surface of the InP region 13. The mesa 29 is buried with a burying region 35 that confines carries injected from the electrode 33 into the mesa 29. In the present embodiment, the burying region 33 is made of InP doped with iron (FE). The surface of the burying region is covered by a passivation film 37.

Typical conditions of each semiconductor layers are listed in the table below:

TABLE

Conditions of layers

| Layer | | Conditions |
|---|---|---|
| InP region | 13 | n-type InP substrate |
| AlGaInAs layer | 15 | n-type AlGaInAs |
| | | t: 20 nm to 40 nm |
| | | $\lambda_{BG}$: 1.0 µm to 1.2 µm |
| Intermediate layer | 19 | n-type InP, n-type GaInAsP, n-type AlInAsP, and/or n-type AlGaInAsP |
| | | t: 15 nm to 40 nm |
| | | $\lambda_{BG}$: 0.87 µm to 1.2 µm |
| Active layer | 17 | |
| well layers | 21a | undoped AlGaInAs |
| | | $\lambda_{BG}$: 1.4 µm |
| barrier layers | 21b | undoped AlGaInAs |
| | | $\lambda_{BG}$: 1.05 µm |
| Guiding layer | 22 | p-type AlGaInAs |
| | | $\lambda_{BG}$: 1.0 µm |
| Cladding layer | 23 | p-type InP |
| Intermediate layer | 25 | p-type GaInAsP |
| | | $\lambda_{BG}$: 1.2 µm |
| Contact layer | 27 | p-type GaInAs |

Where, the band gap wavelength $\lambda_{BG}$ means the wavelength corresponds to the band gap energy thereof. For example, the band gap wavelength $\lambda_{BG}=1.0$ µm corresponds to the band gap energy of 1.24 eV.

The DFB-LD 11 of the present invention may provide the intermediate layer 19 made of GaInAsP for guiding light, the band gap wavelength of which may be smaller than 1.2 µm because a mass transportation may be accelerated during the growth of the intermediate layer 19 in the case that the band gap wavelength smaller than 1.2 µm. The mass transportation enables to form an additional layer on the AlGaInAs layer 15; accordingly, the periodic undulation 20 may be buried without thickening the intermediate layer 19.

Moreover, the DFB-LD 11 may include well layers 21a made of AlGaInAs, barrier layer 21b made of AlGaInAs, and the intermediate layer 19 of InP. In this case, these layers, 19, 21a, and 21b, only include one type of group V element, namely, phosphorous for the layer 19 and arsenide for layers 21a and 21b, accordingly, the composition of these layers may be adjusted by controlling only the supplement of the group V element, which enables to enhance the yield of the device.

In other cases where the DFB-LD 11 may provide the intermediate layer 19 made of AlInAsP or AlGaInAsP, which also causes the mass transportation during the growth of the layer 19.

The grating of the DFB-LD 11 is composed at least the InP region 13 and the AlGaInAs layer 15 on the periodic undulation 20 of the InP region 13. The depth, in other words, the height H1 of the undulation may be from 30 nm to 50 nm. The thickness of the intermediate layer 19 may be smaller than 40 nm to ensure enough coupling efficiency between the grating and the active layer 17, which may reduce the failure in the side mode suppression ratio (SMSR).

Figure 4A:
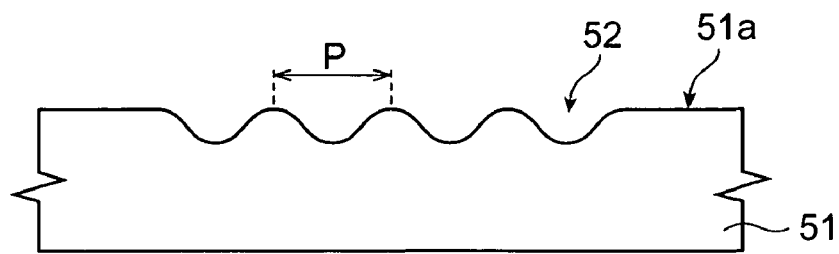
FIG. 4A shows a process for forming a periodic undulation of the grating of the DFB-LD.
Figure 4B:
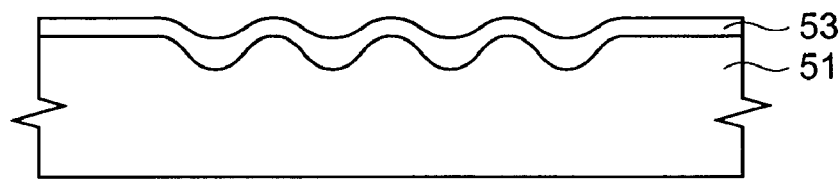
FIG. 4B shows a process for burying the periodic undulation.
Figure 4C:
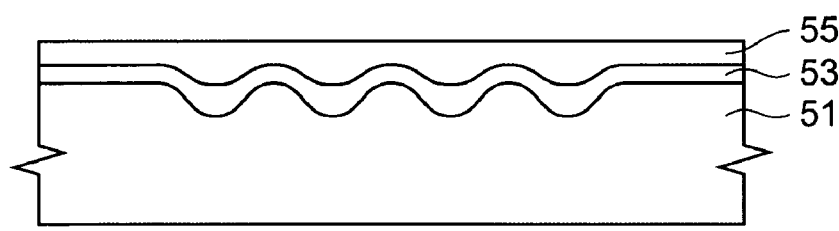
FIG. 4C shows a process for forming the grating.
Figure 5A:
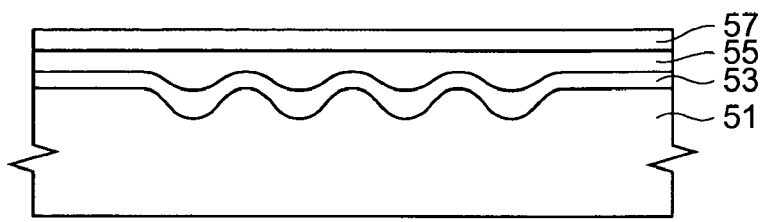
FIG. 5A shows a process for forming an active layer of the DFB-LD.
Figure 5B:
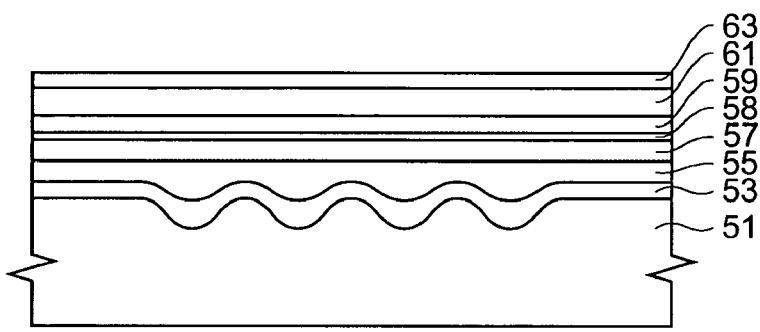
FIG. 5B shows a process for epitaxially growing semiconductor layers.
Figure 5C:
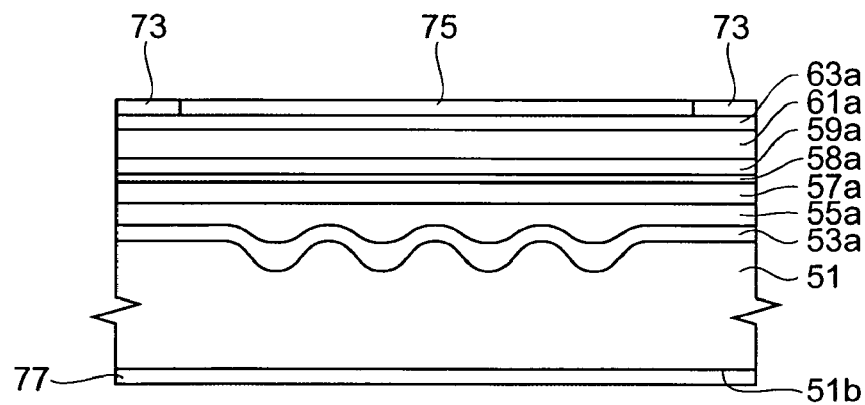
FIG. 5C shows a process for forming electrodes of the DFB-LD.
Figure 6A:
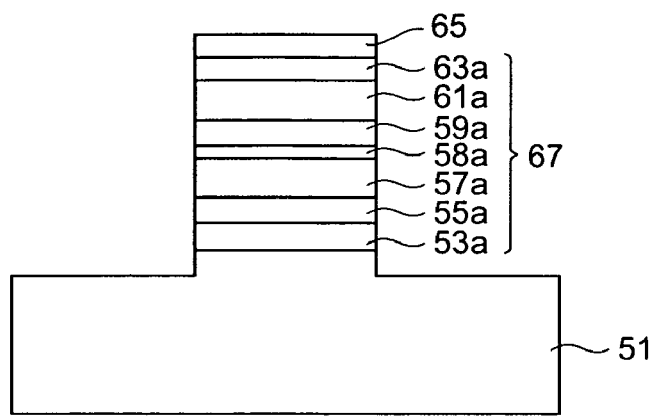
FIG. 6A shows a process for forming a mesa.

A preferred embodiment of the present invention will be described as referring to FIGS. 4 to 6. First, an n-type InP substrate 51 is prepared. The InP substrate 51 provides a periodic undulation 52 with a depth of 40 nm and a pitch P of 203 nm on a primary surface thereof as shown in FIG. 4A. This periodic undulation 52 may be formed by, for example, the electron-beam exposure method.

Next, setting the InP substrate 51 within a growth chamber of the Organic-Metal Vapor Phase Epitaxy (OMVPE) apparatus and exhausting the chamber to 60 Torr (133.322 Pa), the chamber is heated up to 400° C. as supplying hydrogen ($H_2$) gaseous with a flow rate of 10 slm. Supplying a mixed gaseous of phosphine ($PH_3$) with 50 sccm and arsine ($AsH_3$) with 0.5 sccm as keeping the temperature of the chamber at 400° C. Raising the temperature of the chamber to 550° C., the n-type AlGaInAs layer 53 is grown at 550° C. to a thickness of which becomes 30 nm, as shown in FIG. 4B. In this growth of the n-type AlGaInAs layer 53, source materials for group III elements of Tri-Methyl-Aluminum (TMAl), Tri-Ethyl-Gallium (TEGa), and Tri-Methyl-Indium (TMIn) are used, respectively, and a di-silane ($Si_2H_6$) is for dopant atoms. The band gap wavelength of the grown n-type AlGaInAs layer 53 was 1.0 μm.

Subsequent to the growth of the n-type AlGaInAs layer 53, the n-type GaInAsP intermediate layer 55 with a thickness of 20 nm was grown after the chamber is heated up to 650° C. The band gap wavelength of the intermediate layer 55 is 1.1 μm. Here, when the intermediate layer includes phosphorous as the group V element, a temperature for growing the intermediate layer 55 may be higher than 600° C. to accelerate the mass transportation.

Then, the chamber is again heated up to 700° C. as supplying a mixed gases of the $PH_3$ and the $AH_3$, the flow rate of which was $PH_3:AH_3=100:1$. After the temperature becomes stable at 700° C., the active layer 57 was grown as shown in FIG. 5A. The active layer 57 comprises a plurality of well layers and a plurality of barrier layers. These well and barrier layers are alternately stacked to each other and each made of AlGaInAs with different compositions. The band gap wavelength of the well layer is $\lambda_{BG}=1.4$ μm, while, that of the barrier layer is $\lambda_{BG}=1.05$ μm, where the well layers suffer a compressive stress of about 1%.

Next, cooling down the chamber to 650° C. after the growth of the active layer 57, the p-type AlGaInAs optical guiding layer 58, the p-type InP cladding layer 59, the p-type GaInAsP layer 61, and p-type GaInAs contact layer are successively grown with thicknesses of 40 nm, 2.0 μm, 0.1 μm, and 0.2 μm, respectively.

Subsequent to the successive growth of the semiconductor layers, a stripe mask 65 with a width of 1.5 μm and made of silicon inorganic material such as $SiO_2$ is formed on the grown semiconductor layers. As shown in FIG. 6A, a dry etching using a reactive gas mixed with chlorine ($Cl_2$) and nitrogen ($N_2$) forms a mesa 67 with a height of 4.0 μm. This mesa 67 includes, from the bottom thereof, the n-type AlGaInAs layer 53a, the n-type GaInAsP intermediate layer 55a, the active layer 57a, the p-type AlGaInAs optical guiding layer 58a, the p-type cladding layer 59a, the p-type GaInAsP layer 61a, and the p-type GaInAs contact layer 63a. A portion of the InP substrate 51 was also etched in this process.

Figure 6B:
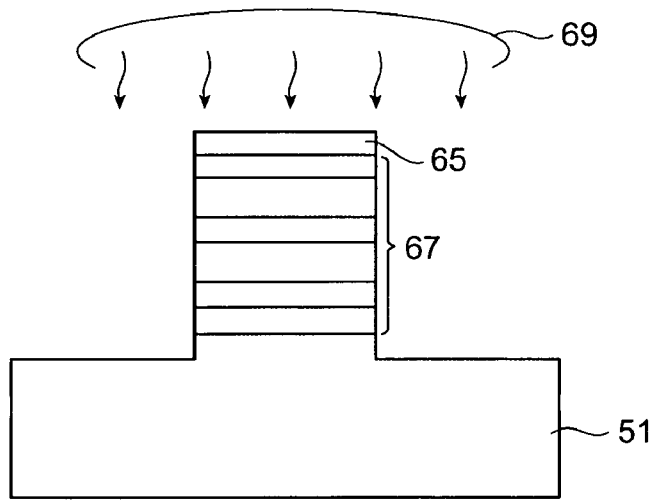
FIG. 6B shows a process for removing damaged layers caused by the dry etching.
Figure 6C:
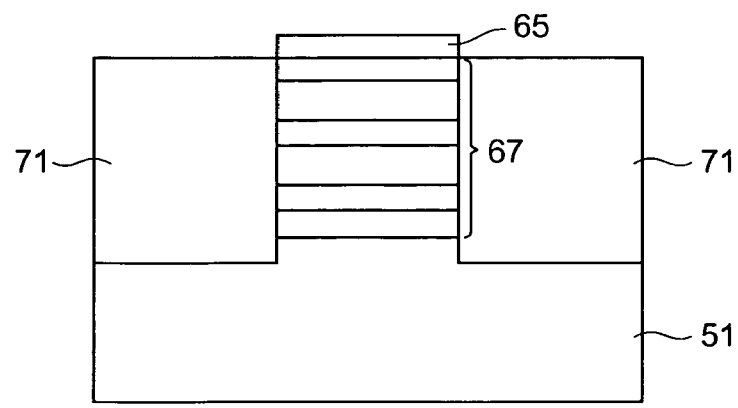
FIG. 6C shows a process for burying the mesa.

After the dry etching, an solution 69 of, for example, hydrochloric acid (HCl), acetic acid ($CH_3COOH$) and hydrogen peroxide ($H_2O_2$), removes layers altered by the dry etching, mainly because of the etching damage, as shown in FIG. 6B. Subsequently, an In-Situ etching may be performed within the chamber of the OMVPE apparatus to remove oxides induced around the active layer, and the burying layer 71 doped with iron (Fe) is successively grown to bury the mesa 67 without bringing the wafer thus processed out of the chamber.

Next, removing the mask 65 with fluoric acid (HF), a silicon oxide film $SiO_2$ 73 is formed on the whole surface with the plasma enhanced chemical vapor deposition (P-CVD) technique. The $SiO_2$ film 73 has an opening on the mesa. As shown in FIG. 5C, a stacked metal of AuZn/Ti/Pt/Au are evaporated onto the contact layer 63a to form the anode electrode 75. Thinning the substrate 51 to about 100 μm and polishing the back surface 51b of the substrate 51, the AuGeNi eutectic metal is evaporated onto the back surface of the substrate to form the cathode electrode 77 after removing the mechanically damaged layer.

Finally, alloying two electrodes, 75 and 77, cleaving the substrate such that the resonator length of the DFB-LD becomes about 250 μm, and coating the cleaved surfaces with an anti-reflective film and a high-reflective film, respectively, the DFB-LD according to the present invention with an emission wavelength thereof to be 1.3 μm can be obtained.

The invention has been described in detail while making reference to an embodiment thereof. Since it is known that others skilled in the art will readily recognize yet other embodiments that are within the spirit and scope of this invention, the above detailed description is not to be taken as a limitation on the spirit and scope of this invention. It is, therefore, intended that such embodiments be covered by the appended claims.

What is claimed is:

1. A distributed feedback semiconductor laser diode with a diffraction grating, comprising:
    an InP semiconductor region having a surface with a periodic undulation;
    an AlGaInAs semiconductor layer provided on the surface of the InP semiconductor region, the AlGaInAs semiconductor layer having a surface with an undulation that substantially traces the periodic undulation of the surface of the InP semiconductor region;
    an intermediate layer provided on another surface of the AlGaInAs semiconductor layer, the intermediate layer being made of a semiconductor material selected from a group consisting of GaInAsP, AlInAsP and AlGaInAsP; and
    an active layer provided on the intermediate layer, the active layer including a quantum well structure,
    wherein the InP semiconductor region, the AlGaInAs semiconductor layer and the intermediate layer constitute the diffraction grating.

2. The distributed feedback laser diode according to claim 1,
    wherein the intermediate layer is made of GaInAsP with a band gap wavelength smaller than 1.2 μm.

3. The distributed feedback laser diode according to claim 1,
    wherein the quantum well structure comprises a well layer made of AlGaInAs with a first composition and a barrier layer made of AlGaInAs with a second composition different from the first composition.

4. The distributed feedback laser diode according to claim 1,
    wherein the periodic undulation of the surface of the InP region has a depth between 30 nm and 50 nm.

5. The distributed feedback laser diode according to claim 4,
    wherein the intermediate layer has a thickness smaller than 40 nm.

6. The distributed feedback laser diode according to claim 1,
    wherein the intermediate layer has a thickness ranging between 15 nm to 40 nm.

7. The distributed feedback laser diode according to claim 1,
wherein the AlGaInAs layer has a thickness less than 40 nm.

8. The distributed feedback laser diode according to claim 1,
wherein the AlGaInAs layer has a thickness ranging between 20 nm to 40 nm.

9. The distributed feedback laser diode according to claim 1,
wherein the intermediate layer has a band gap wavelength ranging between 0.87 µm to 1.2 µm.

10. The distributed feedback laser diode according to claim 1,
wherein the AlGaInAs layer has a band gap wavelength ranging between 1.0 µm and 1.2 µm.

11. The distributed feedback laser diode according to claim 1,
wherein the AlGaInAs layer has a band gap wavelength less than 1.2 µm.

12. The distributed feedback laser diode according to claim 1,
wherein the intermediate layer has a band gap wavelength less than 1.2 µm.

13. The distributed feedback laser diode according to claim 3,
wherein the band gap wavelength of the well layer and the barrier layer are 1.4 µm and 1.5 µm, respectively.

14. The distributed feedback laser diode according to claim 3,
wherein the well layer and the barrier layer are undoped AlGaInAs with compositions different from each other.

15. A distributed feedback semiconductor laser diode with a diffraction grating, comprising:
an InP semiconductor region having a primary surface;
an AlGaInAs semiconductor layer provided on the primary surface of the InP semiconductor substrate;
an intermediate layer provided on the AlGaInAs semiconductor layer, the intermediate layer being made of one of InP, GaInAsP, AlInAsP and AlGaInAsP; and
an active layer provided on the intermediate layer, the active layer including a quantum well structure,
wherein the primary surface of the InP semiconductor substrate and the AlGaInAs semiconductor layer forms an undulation with a predetermined period, and
wherein the InP semiconductor substrate, the AlGaInAs semiconductor layer and the intermediate layer constitute the diffraction grating.

\* \* \* \* \*